(12) United States Patent
Chang et al.

(10) Patent No.: US 8,098,522 B2
(45) Date of Patent: Jan. 17, 2012

(54) NON-VOLATILE MEMORY AND OPERATION METHOD THEREOF

(75) Inventors: Yao-Wen Chang, Hsinchu (TW); Guan-Wei Wu, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 289 days.

(21) Appl. No.: 12/574,093

(22) Filed: Oct. 6, 2009

(65) Prior Publication Data
US 2011/0080784 A1 Apr. 7, 2011

(51) Int. Cl.
*G11C 11/34* (2006.01)
(52) U.S. Cl. .......... 365/185.03; 365/185.17; 365/185.14
(58) Field of Classification Search .............. 365/185.03, 365/185.17, 185.14
See application file for complete search history.

(56) References Cited

U.S. PATENT DOCUMENTS

| | | | |
|---|---|---|---|
| 7,468,924 B2 * | 12/2008 | Kwon | 365/195 |
| 2007/0121386 A1 | 5/2007 | Ho et al. | |
| 2007/0159880 A1 | 7/2007 | Eitan | |
| 2007/0297227 A1 | 12/2007 | Wu | |
| 2008/0158954 A1 | 7/2008 | Hamilton et al. | |

OTHER PUBLICATIONS

H. Seidel et al., "Anisotropic Etching of Crystalline Silicon in Alkaline Solutions: I. Orientation Dependence and Behavior of Passivation Layers" Journal of the Electrochemical Society, vol. 137, No. 11, Nov. 1990, pp. 3612-3625.
H. Seidel et al., "Anisotropic Etching of Crystalline Silicon in Alkaline Solutions: II. Influence of Dopants" Journal of the Electrochemical Society, vol. 137, No. 11, Nov. 1990, pp. 3626-3632.

* cited by examiner

*Primary Examiner* — Son Dinh
*Assistant Examiner* — Nam Nguyen
(74) *Attorney, Agent, or Firm* — J.C. Patents

(57) ABSTRACT

An operation method of a non-volatile memory suitable for a multi-level cell having a first storage position and a second storage position is provided. The operation method includes: setting N threshold-voltage distribution curves, wherein the N threshold-voltage distribution curves correspond to N levels and N is an integer greater than 2; programming the first and the second storage positions to the $1^{st}$ level and an auxiliary level respectively according to the $1^{st}$ threshold-voltage distribution curve and a threshold-voltage auxiliary curve when the first and the second storage positions are programmed to the $1^{st}$ and $N^{th}$ levels; and programming the first and the second storage positions to the $i^{th}$ level according to the $i^{th}$ threshold-voltage distribution curve when the first and the second storage positions are not to be programmed to the $1^{st}$ and $N^{th}$ levels, wherein i is an integer and $1 \leq i \leq N$.

16 Claims, 7 Drawing Sheets

NON-VOLATILE MEMORY AND OPERATION METHOD THEREOF

BACKGROUND OF THE INVENTION

1. Field of the Invention

The present invention relates to a non-volatile memory and an operation method thereof. More particularly, the present invention relates to a non-volatile memory and an operation method thereof including a multi-level cell having a plurality of storage positions.

2. Description of Related Art

A nitride read only memory (NBit) is a nitride structure memory using silicon nitride as a charge trapping layer instead of using a polysilicon floating gate, in which a single NBit memory cell may have two separated charge bits according to a localized charge trapping technique, so as to form a so-called 2 bits/cell storage scheme. Moreover, by respectively program the two bits of the NBit memory cell to a plurality of levels, the NBit memory cell can also serve as a multi-level cell (MLC).

When the NBit memory cell is operated, the two bits in a same memory cell can influence each other to generate a read error problem. In brief, if one side of the NBit memory cell is stored with a bit, the other side of the NBit memory cell is read, and a current of an originally high current part can be decreased, which may lead to a so-called second-bit effect. Namely, when a read operation is performed to the NBit memory cell, the originally existed bit can influence the memory cell to increase a read threshold voltage (Vt). In this case, the read error problem is probably occurred.

FIG. 1 is a diagram illustrating a threshold voltage distribution of a conventional nitride structure MLC. As shown in FIG. 1, curves 110-140 are threshold-voltage distribution curves when a state of the memory cell is respectively level 1 to level 4. Wherein, if a first storage position of the NBit memory cell is maintained to the level 1, a second storage position of the NBit memory cell is programmed to the level 2, and the threshold voltage distribution curve of the first storage position maintained to the level 1 is shifted due to the second-bit effect, and a shift amount thereof is shown as a curve 150. Similarly, curves 160 and 170 respectively represent the shift amount of the threshold voltage distribution curve of the first storage position maintained to the level 1 that is generated due to the second-bit effect, when the second storage position of the NBit memory cell is respectively programmed to the level 3 and the level 4.

As shown in FIG. 1, the higher level the second storage position is programmed, the more severe the second-bit effect is. For example, when the second storage position is programmed to the level 4, the threshold voltage shift curve 170 of the first storage position generated due to the second-bit effect is very closed to the threshold voltage distribution curve 120 programmed to the level 2. Now, if the NBit memory cell is read, the level 1 first storage position can be misjudged to be level 2, so that device reliability is decreased. Moreover, the second-bit effect further reduces a read sense margin of the memory and a threshold-voltage window for operating the right and left bits, so that operation of the MLC can be more difficult.

SUMMARY OF THE INVENTION

The present invention is directed to an operation method of a non-volatile memory, which can improve a read sense margin of the memory.

The present invention is directed to a non-volatile memory, which can improve a read sense margin of the memory.

The present invention provides an operation method of a non-volatile memory suitable for a multi-level cell (MLC) having a first storage position and a second storage position. The operation method includes the following steps. First, N threshold-voltage distribution curves are set, wherein the N threshold-voltage distribution curves correspond to N levels, and N is an integer greater than 2. Next, when the first and the second storage positions are about to be programmed to the $1^{st}$ and $N^{th}$ levels, the first storage position is programmed to the $1^{st}$ level according to the $1^{st}$ threshold-voltage distribution curve, and the second storage position is programmed to an auxiliary level according to a threshold-voltage auxiliary curve located apart from the $1^{st}$ threshold-voltage distribution curve for a sensing window. Next, when the first and the second storage positions are not to be programmed to the $1^{st}$ and $N^{th}$ levels, the first and the second storage positions are programmed to the $i^{th}$ level according to the $i^{th}$ threshold-voltage distribution curve, wherein i is an integer, and $1 \leq i \leq N$.

In an embodiment of the present invention, the operation method of the non-volatile memory further includes determining whether the first and the second storage positions are about to be programmed to the $1^{st}$ and $N^{th}$ levels according to a program instruction.

In an embodiment of the present invention, the step of setting the N threshold-voltage distribution curves includes following steps. First, a sensing window loss is set according to a shift amount of the $1^{st}$ threshold-voltage distribution curve formed due to the $2^{nd}$ to $(N-1)^{th}$ threshold-voltage distribution curves. Next, an upper bound of the $1^{st}$ threshold-voltage distribution curve, the sensing window loss and the sensing window are added to obtain a lower bound of the $2^{nd}$ threshold-voltage distribution curve. Next, an upper bound of the $j^{th}$ threshold-voltage distribution curve and the sensing window are added to obtain a lower bound of the $(j+1)^{th}$ threshold-voltage distribution curve, wherein j is an integer, and $2 \leq j \leq (N-1)$.

In an embodiment of the present invention, the operation method of the non-volatile memory further includes setting the auxiliary level corresponding to the threshold-voltage auxiliary curve; reading states of the first storage position and the second storage position; and determining setting states of the first storage position and the second storage position according to a read result.

In an embodiment of the present invention, the step of determining the setting states of the first storage position and the second storage position according to the read result includes determining the states of the first storage position and the second storage position to be the $1^{st}$ level and the $N^{th}$ level when the read states of the first storage position and the second storage position are the $1^{st}$ level and the auxiliary level; determining the states of the first storage position and the second storage position to be the $1^{st}$ level and a first specific level when the read states of the first storage position and the second storage position are the auxiliary level and the first specific level in the $2^{nd}$ to $(N-1)^{th}$ levels; and determining the states of the first storage position and the second storage position to be a second specific level and a third specific level when the read states of the first storage position and the second storage position are the second specific level and the third specific level specific level in the $1^{st}$ to $(N-1)^{th}$ levels or the $2^{nd}$ to $N^{th}$ levels.

The present invention provides a non-volatile memory. The non-volatile memory includes a source region, a drain region, charge storage structure, a gate and a logic circuit. The source region and the drain region are disposed in a substrate. The charge storage structure is disposed between the source region and the drain region on the substrate, wherein the charge storage structure has a first storage position and a second storage position. The gate is disposed on the charge storage structure. The logic circuit sets N threshold-voltage distribution curves, wherein the N threshold-voltage distribution curves correspond to N levels, and N is an integer greater than 2. Furthermore, the logic circuit programs the first storage position to the $1^{st}$ level according to the $1^{st}$ threshold-voltage distribution curve, and programs the second storage position to an auxiliary level according to a threshold-voltage auxiliary curve located apart from the $1^{st}$ threshold-voltage distribution curve for a sensing window when the first and the second storage positions are programmed to the $1^{st}$ level and the $N^{th}$ level, and the logic circuit programs the first and the second storage positions to the $i^{th}$ level according to the $i^{th}$ threshold-voltage distribution curve when the first and the second storage positions are not programmed to the $1^{st}$ level and the $N^{th}$ level, wherein i is an integer and $1 \leq i \leq N$.

According to the above descriptions, when the MLC is about to be programmed to the $1^{st}$ level and the $N^{th}$ level, the second storage position is programmed to the auxiliary level according to the threshold-voltage auxiliary curve. By such means, the shift amount of the $1^{st}$ threshold-voltage distribution curve formed due to the $N^{th}$ threshold-voltage distribution curve is not considered, so as to effectively improve the read sense margin of the memory. Moreover, during a read operation of the MLC, since the setting states of the MLC and the finally programmed states thereof can be suitably adjusted, after the states of the non-volatile memory are read, the setting states of the first storage position and the second storage position are further determined according to the read result.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
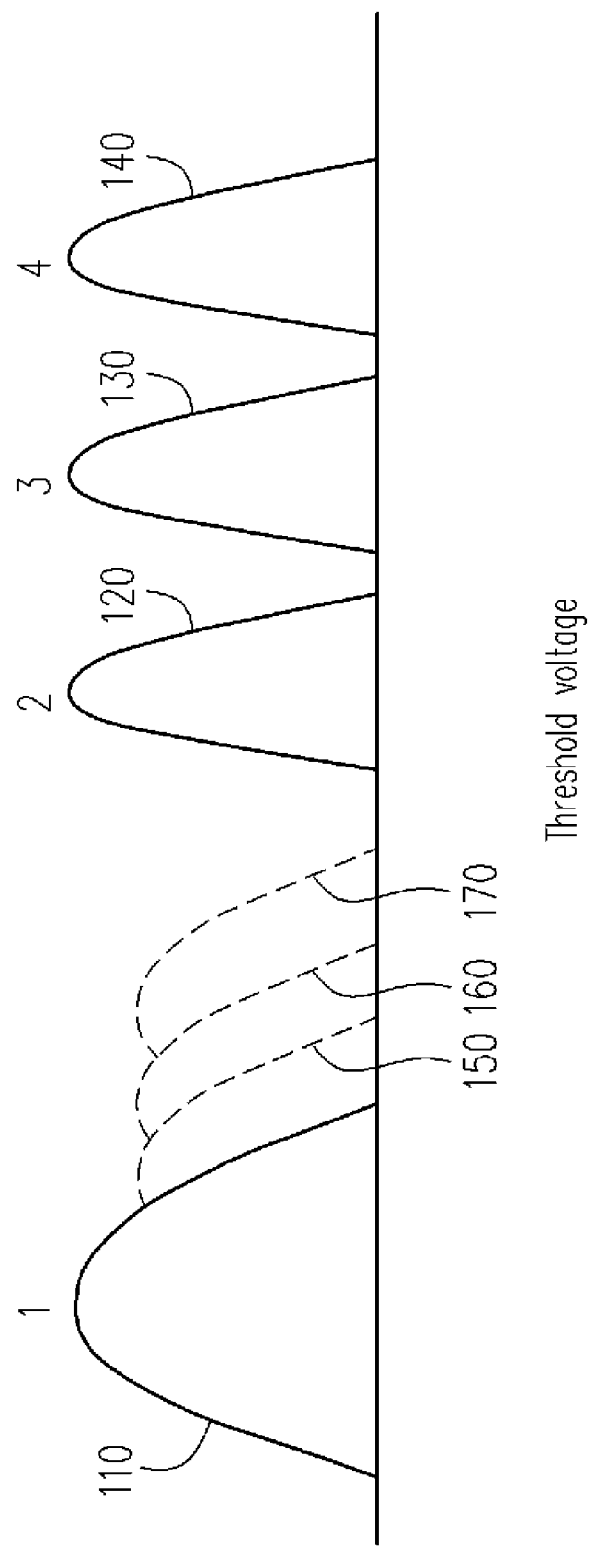
FIG. 1 is a diagram illustrating a threshold voltage distribution of a conventional nitride structure MLC.
Figure 2:
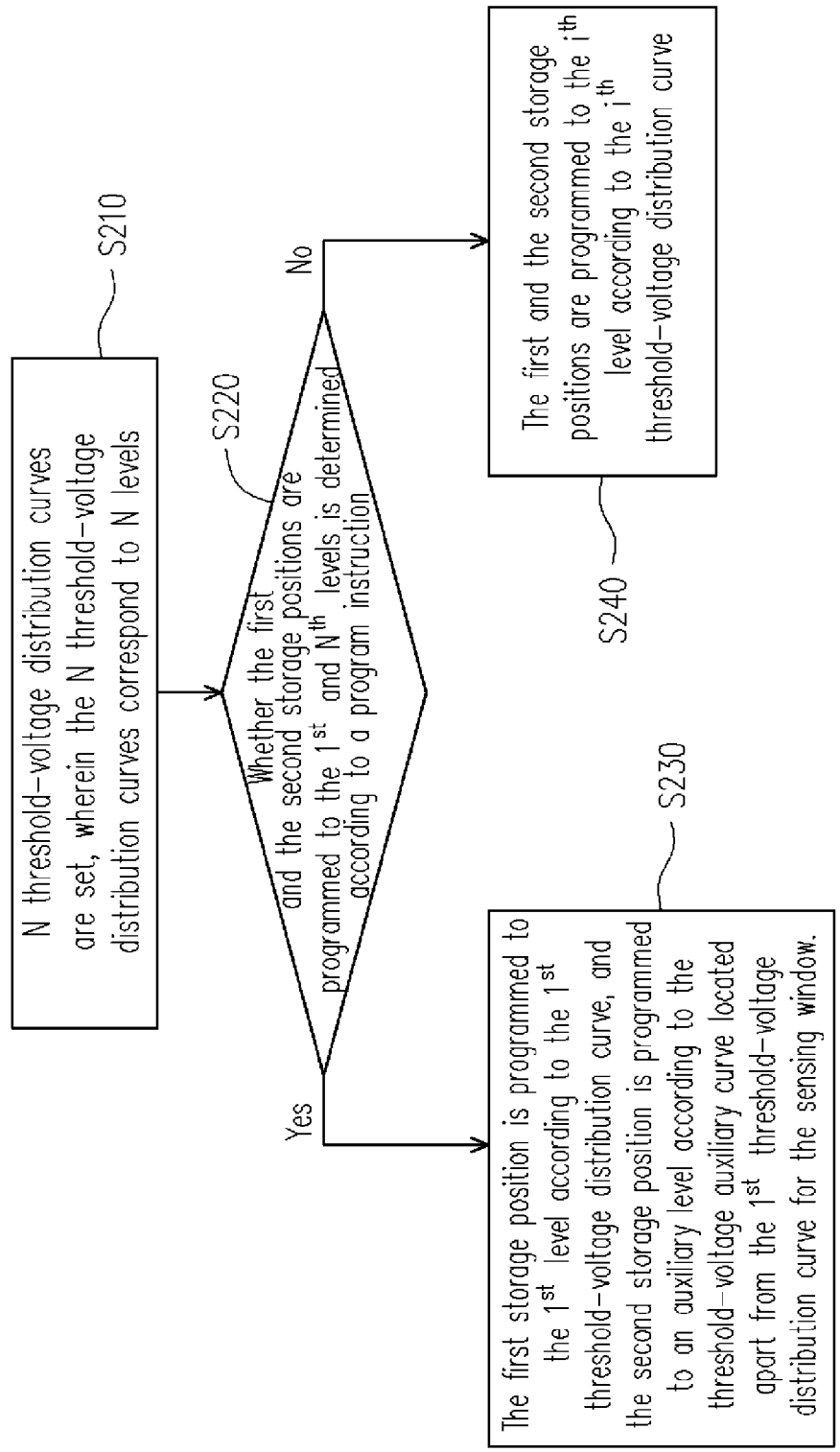
FIG. 2 is a flowchart illustrating a programming method of a non-volatile memory according to an embodiment of the present invention.

FIG. 2 is a flowchart illustrating a programming method of a non-volatile memory according to an embodiment of the present invention. The programming method of the present embodiment is suitable for a multi-level cell (MLC) having a first storage position and a second storage position.

Figure 3:
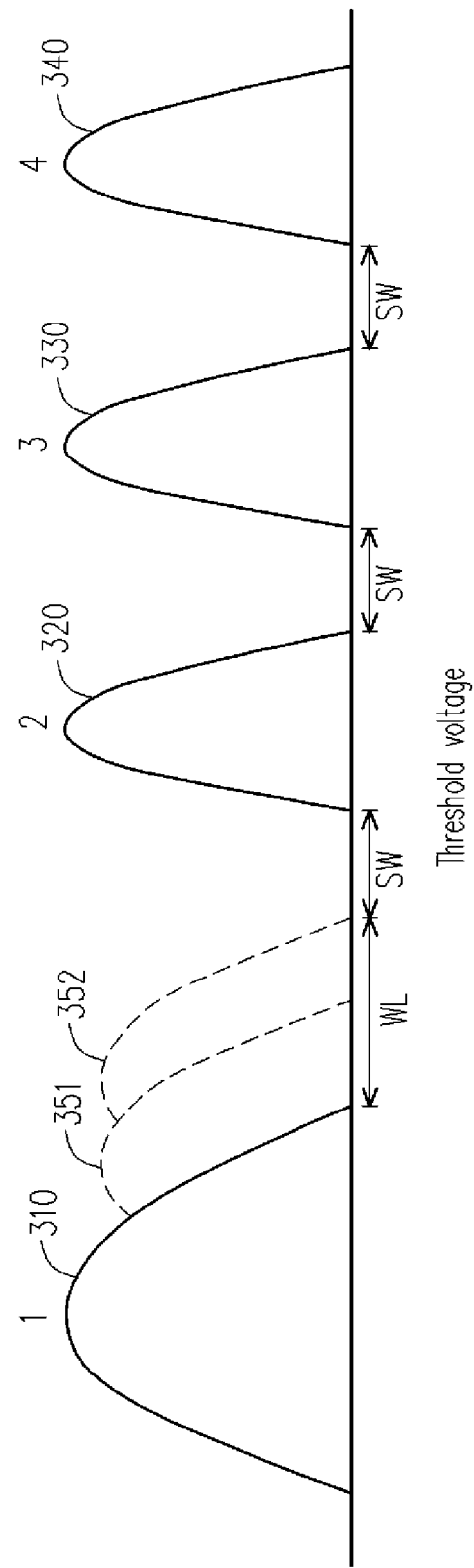
FIG. 3 is a diagram illustrating a threshold-voltage distribution according to an embodiment of the present invention.

Referring to FIG. 2, first, in step S210, N threshold-voltage distribution curves are set, wherein N is an integer greater than 2. Moreover, the N threshold-voltage distribution curves correspond to N levels. For example, FIG. 3 is a diagram illustrating a threshold-voltage distribution according to an embodiment of the present invention. Here, assuming the MLC has 4 levels (N=4), so that states of the MLC include a $1^{st}$ to $4^{th}$ ascending levels 1-4. The levels 1-4 respectively correspond to a $1^{st}$ to $4^{th}$ threshold-voltage distribution curves 310-340.

Figure 4A:
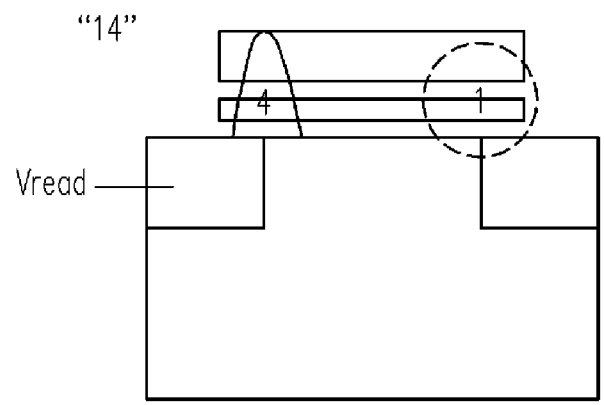
FIGS. 4A-4C are schematic diagrams of representations of an MLC according to an embodiment of the present invention.
Figure 4B:
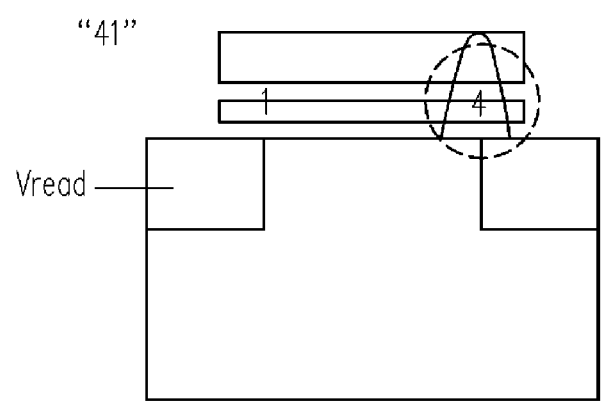
Figure 4C:
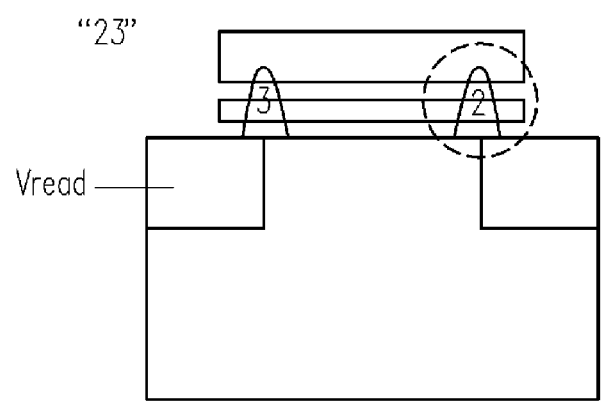

FIGS. 4A-4C are schematic diagrams of representations of an MLC according to an embodiment of the present invention. The multi-level cell includes a source region, a drain region, a charge storage structure and a gate. The source region and the drain region are disposed in a substrate. The charge storage structure is disposed between the source region and the drain region on the substrate, wherein the charge storage structure has a first storage position and a second storage position. The gate is disposed on the charge storage structure. In the following embodiments, xy represents the levels of the first storage position and the second storage position, wherein x represents the level of the storage position to be read, and y represents the level of the adjacent storage position. For example, as shown in FIG. 4A, in a state "14", 1 represents the level of the storage position to be read, and 4 represents the level of the adjacent storage position. As shown in FIG. 4B, in a state "41", 4 represents the level of the storage position to be read, and 1 represents the level of the adjacent storage position. As shown in FIG. 4C, in a state "23", 2 represents the level of the storage position to be read, and 3 represents the level of the adjacent storage position. Read operation is done by reverse-read scheme in which the read bias is applied at the far side source/drain junction.

It should be noticed that setting of the threshold-voltage distribution curves 310-340 considers a second-bit effect of the non-volatile memory. For example, when the states of the first storage position and the second storage position are "12", a shift of the threshold voltage of the first storage position that is formed due to the second-bit effect, i.e. a shift of the threshold-voltage distribution curve 310 formed due to the threshold-voltage distribution curve 320 is shown as a curve 351. Similarly, when the states of the first storage position and the second storage position are "13", a shift of the threshold-voltage distribution curve 310 formed due to the threshold-voltage distribution curve 330 is shown as a curve 352. Now, a sensing window loss WL can be defined according to the threshold-voltage shift curves 351 and 352.

To avoid a read error of the MLC, an upper bound (a maximum value) of the threshold-voltage distribution curve 310, the sensing window loss WL and a sensing window SW are added to obtain a lower bound (a minimum value) of the threshold-voltage distribution curve 320. Moreover, a lower bound of the threshold-voltage distribution curve 330 is set by adding an upper bound of the threshold-voltage distribution curve 320 and the sensing window SW, and a lower bound of the threshold-voltage distribution curve 340 is set by adding an upper bound of the threshold-voltage distribution curve 340 and the sensing window SW.

In other words, a method of setting the N threshold-voltage distribution curves (the step S210) includes following steps. First, a sensing window loss is set according to a shift amount of the $1^{st}$ threshold-voltage distribution curve formed due to the $2^{nd}$ to $(N-1)^{th}$ threshold-voltage distribution curves. Next, an upper bound of the $1^{st}$ threshold-voltage distribution curve, the sensing window loss and the sensing window are added to obtain a lower bound of the $2^{nd}$ threshold-voltage distribution curve. Next, an upper bound of the $j^{th}$ threshold-voltage distribution curve and the sensing window are added to obtain a lower bound of the $(j+1)^{th}$ threshold-voltage distribution curve, wherein j is an integer, and $2 \leq j \leq (N-1)$.

It should be noticed that the lower bounds of the threshold-voltage distribution curves 320-340 are sequentially set according to the shift amount (the sensing window loss WL) of the threshold-voltage distribution curve 310 formed due to the threshold-voltage distribution curves 320-330. Moreover, since the shift amount of the threshold-voltage distribution curve 310 formed due to the threshold-voltage distribution curves 340 is not considered, the read sense margin of the memory can be effectively improved.

Comparatively, since the shift amount of the threshold-voltage distribution curve 310 formed due to the threshold-voltage distribution curves 340 is not considered, when the states of the first storage position and the second storage position are set to "14", an additional threshold-voltage auxiliary curve is referenced to program the MLC, and a corresponding read method is applied to determine the states of the MLC.

Referring to FIG. 2 again, during a process of programming the MLC, in step S220, whether the first and the second storage positions are about to be programmed to the $1^{st}$ and $N^{th}$ levels is determined according to a program instruction. For example, if N=4, in the step S220, it is determined whether the first and the second storage positions are about to be programmed to the states "14", i.e. whether the first and the second storage positions are about to be programmed to the $1^{st}$ and the $4^{th}$ level. Therefore, if the first and the second storage positions are about to be programmed to the $1^{st}$ level and the $N^{th}$ level, a step S230 is executed. Otherwise, a step S240 is executed.

In the step S230, the first storage position is programmed to the $1^{st}$ level according to the $1^{st}$ threshold-voltage distribution curve, and the second storage position is programmed to an auxiliary level according to the threshold-voltage auxiliary curve located apart from the $1^{st}$ threshold-voltage distribution curve for the sensing window.

Figure 5:
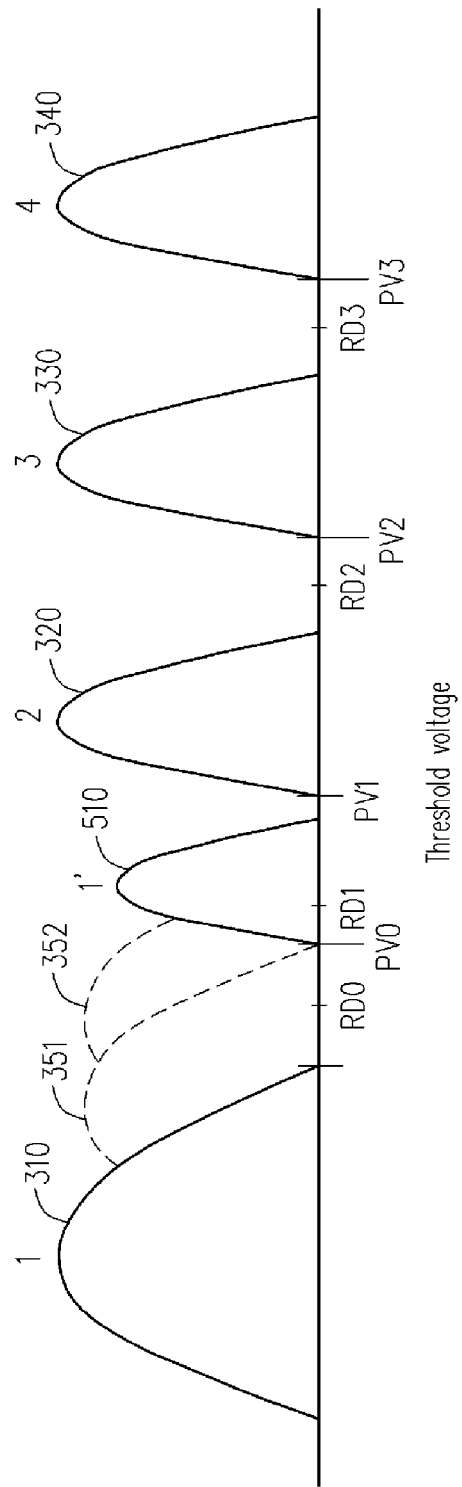
FIG. 5 is a schematic diagram of a threshold-voltage auxiliary curve and a threshold-voltage distribution curve.

For example, FIG. 5 is a schematic diagram of the threshold-voltage auxiliary curve and the threshold-voltage distribution curve, wherein N=4. When the first and the second storage positions are about to be programmed to the state "14", during the programming process of the second storage position, a lower bound of the threshold-voltage auxiliary curve 510 is obtained by adding the upper bound of the threshold-voltage distribution curve 310 and the sensing window SW, so as to complete setting the threshold-voltage auxiliary curve 510. Wherein, the threshold-voltage auxiliary curve 510 is set between the threshold-voltage distribution curves 310 and 320, and is partially overlapped to the threshold-voltage shift curves 351 and 352. Then, the lower bound of the threshold-voltage auxiliary curve 510 is set to an auxiliary write verification voltage PV0. Therefore, the state of the second storage position programmed to the auxiliary level 1' can be verified according to the auxiliary write verification voltage PV0.

In other words, the method of programming the second storage position to the auxiliary level according to the threshold-voltage auxiliary curve located apart from the $1^{st}$ threshold-voltage distribution curve for the sensing window include following steps. First, the upper bound of the $1^{st}$ threshold-voltage distribution curve and the sensing window are added to obtain the lower bound of the threshold-voltage auxiliary curve. Next, the lower bound of the threshold-voltage auxiliary curve is set to the auxiliary write verification voltage. Next, the state of the second storage position programmed to the auxiliary level is verified according to the auxiliary write verification voltage.

On the other hand, when the first and the second storage positions are about to be programmed to the states "14", during the programming process of the first storage position, the first storage position is programmed according to the threshold-voltage distribution curve 310. Therefore, when the first and the second storage positions are about to be programmed to the states "14", the first storage position and the second storage position are substantially programmed to the level 1 and the auxiliary level 1'. Therefore, in the present embodiment, the shift amount of the threshold-voltage distribution curve 310 caused by the threshold-voltage distribution curve 340 is unnecessarily to be considered, so as to improve the read sense margin of the memory.

Referring to FIG. 2 and FIG. 5 again for detailed description of the step S240, when the first and the second storage positions are about to be programmed to the states "23", according to a determination of the step S220, the step S240 is executed. In the step S240, a $1^{st}$ write verification voltage PV1 is set with reference of the lower bound of the threshold-voltage distribution curve 320. Moreover, a $2^{nd}$ write verification voltage PV2 is set with reference of the lower bound of the threshold-voltage distribution curve 330. Deduced by analogy, a $3^{rd}$ write verification voltage PV3 is set.

After the write verification voltages PV1-PV3 are set, since the states of the first and the second storage positions are set to "23", the state of the first storage position programmed to the level 2 is verified according to the write verification voltage PV1, and the state of the second storage position programmed to the level 3 is verified according to the write verification voltage PV2. Therefore, when the states of the first and the second storage positions are set to "23", the first and the second storage positions are substantially programmed to the level 2 and level 3.

In other words, a method of programming the first and the second storage positions to the $i^{th}$ level according to the threshold-voltage distribution curve includes following steps. First, a $1^{st}$ to $(N-1)^{th}$ write verification voltages are set according to the lower bounds of the $2^{nd}$ to the $N^{th}$ threshold-voltage distribution curves. Next, the state of the first and the second storage positions programmed to the $(k+1)^{th}$ level is verified according to the $k^{th}$ write verification voltage, wherein k is an integer and $1 \leq k \leq (N-1)$.

Figure 6:
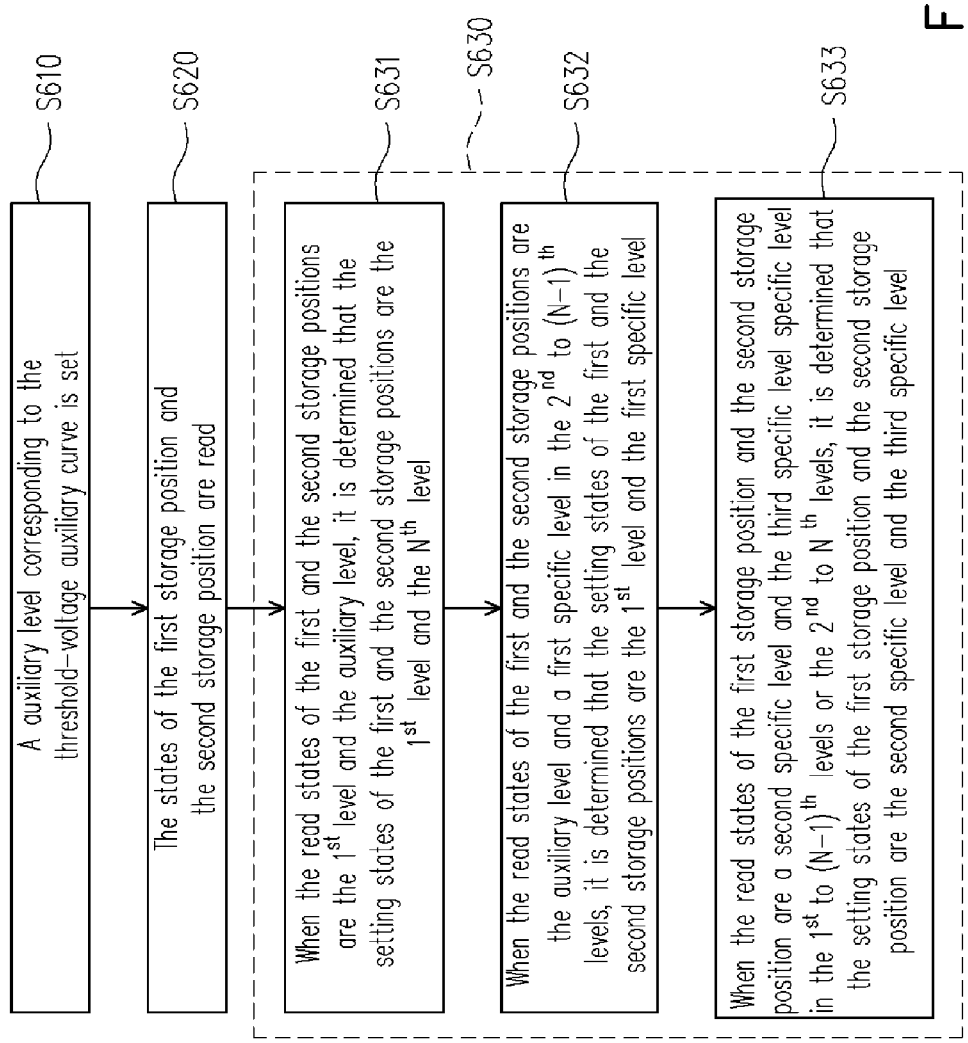
FIG. 6 is a flowchart illustrating a read method of a non-volatile memory according to an embodiment of the present invention.

FIG. 6 is a flowchart illustrating a read method of a non-volatile memory according to an embodiment of the present invention. Referring to FIG. 5 and FIG. 6, first, in step S610, the auxiliary level 1' corresponding to the threshold-voltage auxiliary curve 510 is set. Next, in step S620, the states of the first storage position and the second storage position are read.

For example, as shown in FIG. 5, if N=4, during a process of reading the states of the first storage position and the second storage position, first, a intermediate value of the upper bound of the threshold-voltage distribution curve 310 and the lower bound of the threshold-voltage auxiliary curve 510 is set to an auxiliary read verification voltage RD0. Moreover, an intermediate value of the upper bound of the threshold-voltage distribution curve 310 or the upper bound of the sensing window loss WL of 351 and 352 and the lower bound of the threshold-voltage distribution curve 320 is set to a $1^{st}$ read verification voltage RD1. Similarly, in the present embodiment, an intermediate value of the upper bound of the threshold-voltage distribution curve 320 and the lower bound of the threshold-voltage distribution curve 330 is set to a $2^{nd}$ read verification voltage RD2. Deduced by analogy, a $3^{rd}$ read verification voltage RD3 is set. By such means, the first storage position and the second storage position are read according to the auxiliary read verification voltage RD0 and the read verification voltages RD1-RD3.

In other words, the step S620 includes following detailed steps. First, an intermediate value of the upper bound of the $1^{st}$ threshold-voltage distribution curve and the lower bound of the threshold-voltage auxiliary curve is set to the auxiliary read verification voltage. Next, an intermediate value of an upper bound of the $s^{th}$ threshold-voltage distribution curve and a lower bound of the $(s+1)^{th}$ threshold-voltage distribution curve is set to the $s^{th}$ read verification voltage, wherein s is an integer and $1 \leq s \leq (N-1)$. Next, the first storage position and the second storage position are read according to the auxiliary read verification voltage and the $1^{st}$ to the $(N-1)^{th}$ read verification voltages.

It should be noticed that regarding a process of programming the non-volatile memory, when the first and the second storage positions are about to be programmed to the $1^{st}$ level and the $N^{th}$ level (for example, the state "14"), the first and the second storage positions are substantially programmed to the $1^{st}$ level and the auxiliary level (for example, the state 11"). In other words, setting states of the first and the second storage positions and the finally programmed states thereof can be suitably adjusted. Therefore, during a process of reading the non-volatile memory, after the states of the non-volatile memory are read according to the step S620, the setting states of the first and the second storage positions are further determined according to a read result (step S630).

Regarding a detailed description of the step S630, in step S631, when the read states of the first and the second storage positions are the $1^{st}$ level and the auxiliary level (for example, the state 11'), it is determined that the setting states of the first and the second storage positions are the $1^{st}$ level and the $N^{th}$ level (for example, the state 14).

Comparatively, in step S632, when the read states of the first and the second storage positions are the auxiliary level and a first specific level in the $2^{nd}$ to $(N-1)^{th}$ levels, it is determined that the setting states of the first and the second storage positions are the $1^{st}$ level and the first specific level. For example, when the read states of the first and the second storage positions are "1'2", it is determined that the setting states of the first and the second storage positions are "12". Comparatively, when the read states of the first and the second storage positions are "1'3", it is determined that the setting states of the first and the second storage positions are "13".

Further, in step S633, when the read states of the first storage position and the second storage position are a second specific level and a third specific level specific level in the $1^{st}$ to $(N-1)^{th}$ levels or the $2^{nd}$ to $N^{th}$ levels, it is determined that the setting states of the first storage position and the second storage position are the second specific level and the third specific level. For example, when the read states of the first storage position and the second storage position are "12", it is determined that the setting states of the first storage position and the second storage position are "12". When the read states of the first storage position and the second storage position are "13", it is determined that the setting states of the first storage position and the second storage position are "13". When the read states of the first storage position and the second storage position are "11", it is determined that the setting states of the first storage position and the second storage position are "11". When the read states of the first storage position and the second storage position are "24", it is determined that the setting states of the first storage position and the second storage position are "24".

Figure 7:
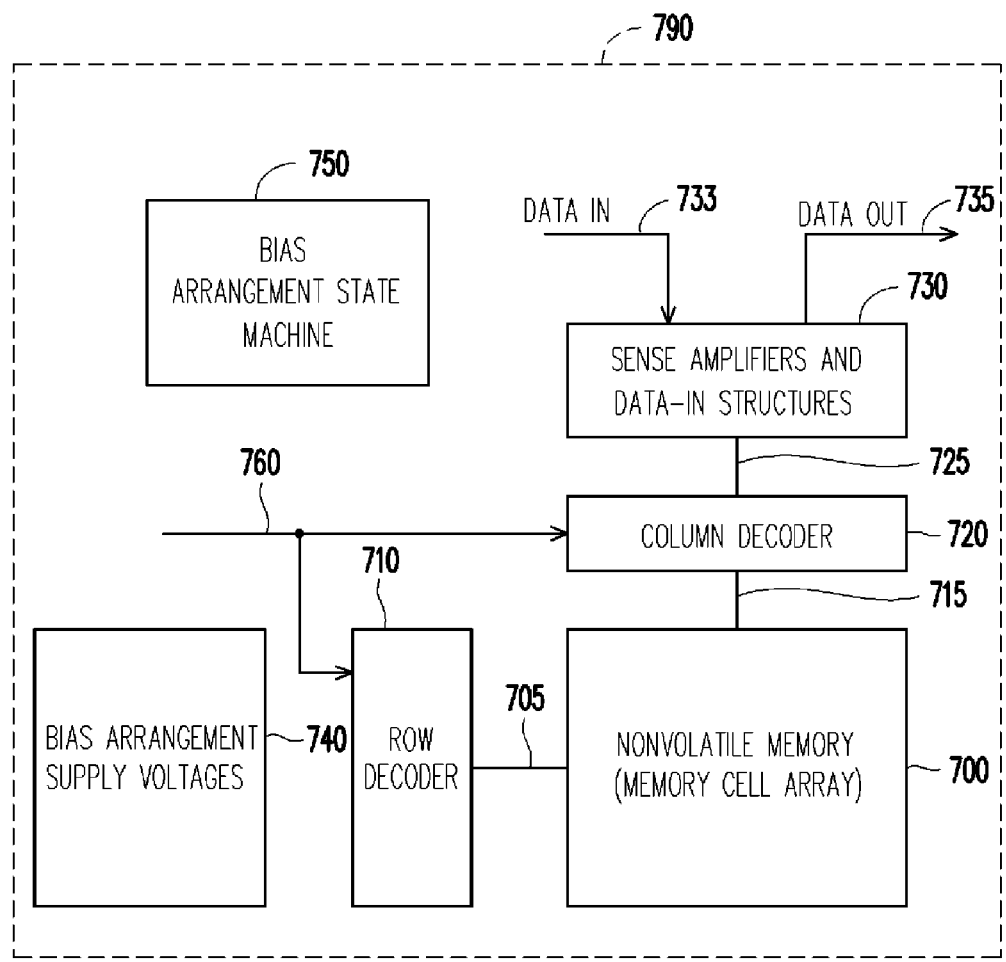
FIG. 7 is a simplified circuit block diagram of an integrated circuit applying an embodiment of the present invention.

FIG. 7 is a simplified circuit block diagram of an integrated circuit applying an embodiment of the present invention. The circuit 790 includes a nonvolatile memory (memory cell array) 700, a row decoder 710, a column decoder 720, a sense amplifiers and data-in structures 730, a bias arrangement supply voltages 740 and a bias arrangement state machine 750.

The memory cell array 700 is disposed on a semiconductor substrate and includes memory cells which have multi-bits per cell. A row decoder 710 is coupled to a plurality of word lines 705, and arranged along rows in the memory cell array 700. A column decoder 720 is coupled to a plurality of bit lines 715 arranged along columns in the memory cell array 700 for reading and programming data from the multi-bit memory cells in the array 700. Addresses are supplied on bus 760 to column decoder 720 and row decoder 710.

Sense amplifiers and data-in structures 730 are coupled to the column decoder 720 via data bus 725. Data is supplied via the data-in line 733 from input/output ports on the circuit 790 or from other data sources internal or external to the circuit 790, to the data-in structures in sense amplifiers and data-in structures 730. In the illustrated embodiment, other circuitry is included in the circuit 790, such as a general purpose processor or special purpose application circuitry, or a combination of modules supported by the multi-bit memory cell array. Data is supplied via the data-out line 735 from the sense amplifiers in sense amplifiers and data-in structures 730 to input/output ports on the circuit 790, or to other data destinations internal or external to the circuit 790.

In summary, in the present invention, the states of the MLC are roughly set to the $1^{st}$ level and the $N^{th}$ level. Therefore, when the MLC are about to be programmed to the $1^{st}$ level and the $N^{th}$ level, the second storage position is programmed to the auxiliary level according to the threshold-voltage auxiliary curve. By such means, the shift amount of the $1^{st}$ threshold-voltage distribution curve formed due to the $N^{th}$ threshold-voltage distribution curve is not considered, so as to effectively improve the read sense margin of the memory. Moreover, during a read operation of the MLC, since the setting states of the MLC and the finally programmed states thereof can be suitably adjusted, after the states of the non-volatile memory are read, the setting states of the first storage position and the second storage position are further determined according to the read result.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operation method of a non-volatile memory, suitable for a multi-level cell (MLC) having a first storage position and a second storage position, the operation method of the non-volatile memory comprising:

setting N threshold-voltage distribution curves, wherein the N threshold-voltage distribution curves correspond to N levels, and N is an integer greater than 2;

programming the first storage position to the $1^{st}$ level according to the $1^{st}$ threshold-voltage distribution curve, and programming the second storage position to an auxiliary level according to a threshold-voltage auxiliary curve located apart from the $1^{st}$ threshold-voltage distribution curve for a sensing window when the first and the second storage positions are programmed to the $1^{st}$ level and the $N^{th}$ level; and programming the first and the second storage positions to the $i^{th}$ level according to the $i^{th}$ threshold-voltage distribution curve when the first and the second storage positions are not programmed to the $1^{st}$ level and the $N^{th}$ level, wherein i is an integer and $1 \leq i \leq N$.

2. The operation method of the non-volatile memory as claimed in claim 1, further comprising:
determining whether the first and the second storage positions are programmed to the $1^{st}$ and $N^{th}$ levels according to a program instruction.

3. The operation method of the non-volatile memory as claimed in claim 1, wherein the step of setting the N threshold-voltage distribution curves comprises:
setting a sensing window loss according to a shift amount of the $1^{st}$ threshold-voltage distribution curve formed due to the $2^{nd}$ to $(N-1)^{th}$ threshold-voltage distribution curves;
adding an upper bound of the $1^{st}$ threshold-voltage distribution curve, the sensing window loss and the sensing window to obtain a lower bound of the $2^{nd}$ threshold-voltage distribution curve; and
adding an upper bound of the $j^{th}$ threshold-voltage distribution curve and the sensing window to obtain a lower bound of the $(j+1)^{th}$ threshold-voltage distribution curve, wherein j is an integer, and $2 \leq j \leq (N-1)$.

4. The operation method of the non-volatile memory as claimed in claim 1, wherein the step of programming the second storage position to the auxiliary level according to the threshold-voltage auxiliary curve located apart from the $1^{st}$ threshold-voltage distribution curve for the sensing window comprises:
adding an upper bound of the $1^{st}$ threshold-voltage distribution curve and the sensing window to obtain a lower bound of the threshold-voltage auxiliary curve;
setting the lower bound of the threshold-voltage auxiliary curve to be an auxiliary write verification voltage; and
verifying a state of the second storage position programmed to the auxiliary level according to the auxiliary write verification voltage.

5. The operation method of the non-volatile memory as claimed in claim 1, wherein the step of programming the first and the second storage positions to the $i^{th}$ level according to the $i^{th}$ threshold-voltage distribution curve comprises:
setting a $1^{st}$ to $(N-1)^{th}$ write verification voltages according to lower bounds of the $2^{nd}$ to the $N^{th}$ threshold-voltage distribution curves; and
verifying a state of the first and the second storage positions programmed to the $(k+1)^{th}$ level according to the $k^{th}$ write verification voltage, wherein k is an integer and $1 \leq k \leq (N-1)$.

6. The operation method of the non-volatile memory as claimed in claim 1, further comprising:
setting the auxiliary level corresponding to the threshold-voltage auxiliary curve;
reading states of the first storage position and the second storage position; and
determining setting states of the first storage position and the second storage position according to a read result.

7. The operation method of the non-volatile memory as claimed in claim 6, wherein the step of determining the setting states of the first storage position and the second storage position according to the read result comprises:
determining the states of the first storage position and the second storage position to be the $1^{st}$ level and the $N^{th}$ level when the read states of the first storage position and the second storage position are the $1^{st}$ level and the auxiliary level;
determining the states of the first storage position and the second storage position to be the $1^{st}$ level and a first specific level when the read states of the first storage position and the second storage position are the auxiliary level and the first specific level in the $2^{nd}$ to $(N-1)^{th}$ levels; and
determining the states of the first storage position and the second storage position to be a second specific level and a third specific level when the read states of the first storage position and the second storage position are the second specific level and the third specific level specific level in the $1^{st}$ to $(N-1)^{th}$ levels or the $2^{nd}$ to $N^{th}$ levels.

8. The operation method of the non-volatile memory as claimed in claim 6, wherein the step of reading the states of the first storage position and the second storage position comprises:
setting a intermediate value of the upper bound of the $1^{st}$ threshold-voltage distribution curve and the lower bound of the threshold-voltage auxiliary curve to an auxiliary read verification voltage;
setting a intermediate value of an upper bound of the $s^{th}$ threshold-voltage distribution curve and a lower bound of the $(s+1)^{th}$ threshold-voltage distribution curve to an $s^{th}$ read verification voltage, wherein s is an integer and $1 \leq s \leq (N-1)$; and
reading the first storage position and the second storage position according to the auxiliary read verification voltage and the $1^{st}$ to the $(N-1)^{th}$ read verification voltages.

9. A non-volatile memory, comprising:
a source region and a drain region, disposed in a substrate;
a charge storage structure, disposed between the source region and the drain region on the substrate, wherein the charge storage structure has a first storage position and a second storage position;
a gate, disposed on the charge storage structure; and
a logic circuit, for setting N threshold-voltage distribution curves, the N threshold-voltage distribution curves corresponding to N levels, and N being an integer greater than 2,
wherein the logic circuit programs the first storage position to the $1^{st}$ level according to the $1^{st}$ threshold-voltage distribution curve, and programs the second storage position to an auxiliary level according to a threshold-voltage auxiliary curve located apart from the $1^{st}$ threshold-voltage distribution curve for a sensing window when the first and the second storage positions are programmed to the $1^{st}$ level and the $N^{th}$ level,
wherein the logic circuit programs the first and the second storage positions to the $i^{th}$ level according to the $i^{th}$ threshold-voltage distribution curve when the first and the second storage positions are not programmed to the $1^{st}$ level and the $N^{th}$ level, wherein i is an integer and $1 \leq i \leq N$.

10. The non-volatile memory as claimed in claim 9, wherein the logic circuit further determines whether the first and the second storage positions are programmed to the $1^{st}$ and $N^{th}$ levels according to a program instruction.

11. The non-volatile memory as claimed in claim 9, wherein when setting the N threshold-voltage distribution curves, the logic circuit further performs:
setting a sensing window loss according to a shift amount of the $1^{st}$ threshold-voltage distribution curve formed due to the $2^{nd}$ to $(N-1)^{th}$ threshold-voltage distribution curves;
adding an upper bound of the $1^{st}$ threshold-voltage distribution curve, the sensing window loss and the sensing window to obtain a lower bound of the $2^{nd}$ threshold-voltage distribution curve; and adding an upper bound of the $j^{th}$ threshold-voltage distribution curve and the sensing window to obtain a lower bound of the $(j+1)^{th}$ threshold-voltage distribution curve, wherein j is an integer, and $2 \leq j \leq (N-1)$.

12. The non-volatile memory as claimed in claim 9, wherein when programming the second storage position to the auxiliary level, the logic circuit further performs:

adding an upper bound of the $1^{st}$ threshold-voltage distribution curve and the sensing window to obtain a lower bound of the threshold-voltage auxiliary curve;

setting the lower bound of the threshold-voltage auxiliary curve to be an auxiliary write verification voltage; and verifying a state of the second storage position programmed to the auxiliary level according to the auxiliary write verification voltage.

13. The non-volatile memory as claimed in claim 9, wherein when programming the first and the second storage positions to the $i^{th}$ level, the logic circuit further performs:

setting a $1^{st}$ to $(N-1)^{th}$ write verification voltages according to lower bounds of the $2^{nd}$ to the $N^{th}$ threshold-voltage distribution curves; and verifying a state of the first and the second storage positions programmed to the $(k+1)^{th}$ level according to the $k^{th}$ write verification voltage, wherein k is an integer and $1 \leq k \leq (N-1)$.

14. The non-volatile memory as claimed in claim 9, wherein the logic circuit further sets the auxiliary level corresponding to the threshold-voltage auxiliary curve and reads states of the first storage position and the second storage position so as to determine setting states of the first storage position and the second storage position according to a read result.

15. The non-volatile memory as claimed in claim 14, wherein when determining the setting states of the first storage position and the second storage position, the logic circuit further performs:

determining the states of the first storage position and the second storage position to be the $1^{st}$ level and the $N^{th}$ level when the read states of the first storage position and the second storage position are the $1^{st}$ level and the auxiliary level;

determining the states of the first storage position and the second storage position to be the $1^{st}$ level and a first specific level when the read states of the first storage position and the second storage position are the auxiliary level and the first specific level in the $2^{nd}$ to $(N-1)^{th}$ levels; and determining the states of the first storage position and the second storage position to be a second specific level and a third specific level when the read states of the first storage position and the second storage position are the second specific level and the third specific level specific level in the $1^{st}$ to $(N-1)^{th}$ levels or the $2^{nd}$ to $N^{th}$ levels.

16. The non-volatile memory as claimed in claim 14, wherein when reading the states of the first storage position and the second storage position, the logic circuit further performs:

setting a intermediate value of the upper bound of the $1^{st}$ threshold-voltage distribution curve and the lower bound of the threshold-voltage auxiliary curve to an auxiliary read verification voltage;

setting a intermediate value of an upper bound of the $s^{th}$ threshold-voltage distribution curve and a lower bound of the $(s+1)^{th}$ threshold-voltage distribution curve to an $s^{th}$ read verification voltage, wherein s is an integer and $1 \leq s \leq (N-1)$; and reading the first storage position and the second storage position according to the auxiliary read verification voltage and the $1^{st}$ to the $(N-1)^{th}$ read verification voltages.

* * * * *